United States Patent
Koleda

(10) Patent No.: US 6,600,663 B1
(45) Date of Patent: Jul. 29, 2003

(54) SHIELDING CAN FOR A PRINTED CIRCUIT BOARD

(75) Inventor: Eugen Koleda, Herlev (DK)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/597,986

(22) Filed: Jun. 19, 2000

(30) Foreign Application Priority Data

Jun. 18, 1999 (GB) .............................................. 9914263

(51) Int. Cl.$^7$ ................................................ H05K 9/00
(52) U.S. Cl. ....................... 361/816; 361/800; 361/814; 361/818; 174/35 R
(58) Field of Search ................................ 361/816, 818, 361/800, 814; 174/35 R

(56) References Cited

U.S. PATENT DOCUMENTS

| | | | |
|---|---|---|---|
| 5,508,889 A | | 4/1996 | Ii |
| 5,536,905 A | * | 7/1996 | Redman et al. ......... 174/35 GC |
| 5,748,455 A | * | 5/1998 | Phillips et al. ............... 361/818 |
| 5,774,344 A | * | 6/1998 | Casebolt ..................... 361/800 |
| 5,883,791 A | * | 3/1999 | Deguchi ..................... 361/818 |
| 5,895,884 A | * | 4/1999 | Davidson .................. 174/35 R |
| 6,058,018 A | * | 5/2000 | Gerrits et al. ............... 361/737 |
| 6,121,544 A | * | 9/2000 | Petsinger .................. 174/35 R |
| 6,137,051 A | * | 10/2000 | Bundza ..................... 174/35 R |
| 6,181,573 B1 | * | 1/2001 | Riet ........................... 361/816 |

FOREIGN PATENT DOCUMENTS

| | | |
|---|---|---|
| EP | 726700 | 8/1996 |
| EP | 735811 | 10/1996 |
| GB | 2297868 | 8/1996 |
| GB | 2297869 | 8/1996 |
| GB | 2322012 | 8/1998 |

* cited by examiner

*Primary Examiner*—David Martin
*Assistant Examiner*—Thanh Yen Tran
(74) *Attorney, Agent, or Firm*—Antonelli, Terry, Stout & Kraus, LLP

(57) ABSTRACT

A shielding can for a printed circuit board which includes a frame with side walls and a lid with apparatus to increase flexibility of the lid. The flexibility apparatus are slits on the sides of the lid. These slits enable a flexible contraction, when soldering the shielding can onto the printed circuit board. The invention also includes a method for mounting the shielding can onto printed circuit boards. The shielding can is placed onto the printed circuit board and heated slowly to melt the solder paste to solder the shielding can to the printed circuit board. The heating phase is followed by a fast cooling phase, and the flexible apparatus (the slits on the shielding can) reduces the internal stress, which occurs when the shielding can is exposed to different temperatures at the same time, without any permanent deformations.

10 Claims, 4 Drawing Sheets

SHIELDING CAN FOR A PRINTED CIRCUIT BOARD

BACKGROUND OF THE INVENTION

The invention relates to a shielding can for protecting components on a printed circuit board (PCB), preferably for a cellular phone, against interference from other components due to EMC. A shielding can is a cage that covers a number of electronic components on a printed circuit board, and thereby protects these components from disturbing other electronic components on the printed circuit board.

The use of shielding cans is well known because all GSM phones have printed circuit boards equipped with different components that disturb each other if they are not shielded from each other.

The shielding cans are usually made in at least two different embodiments. The first embodiment comprises one entire box shaped piece soldered onto the printed circuit board. This type of shielding can does not permit one to access components covered by the shielding can, which makes it very difficult to repair or inspect any of the components covered or shielded by the shielding can. Furthermore it is often required to solder the components beneath the shielding can onto the printed circuit board before soldering the shielding can, because you cannot get enough heat to the components to, make a good solder joint. An alternative is having holes or apertures to let the heat in to solder the components at the same time as the shielding can. However these types of shielding cans are often made of a rather thick material so even with holes or apertures you cannot get enough heat to solder the components properly at the same time as the shielding can.

The second embodiment includes two pieces, one frame and one lid. The lid is snapped onto the frame and can be removed from the frame, which is soldered onto the printed circuit board, to enable repairing or inspection of the components shielded by the shielding can. The second embodiment may be attached to the printed circuit board in different ways. One way is to solder the frame onto the printed circuit board first and then attach the lid to the frame. Another way is snap the lid onto the frame and solder the assembly onto the printed circuit board, but then there is a need for holes or apertures in the lid to let in the heat during soldering. Otherwise the components covered or shielded by the shielding can will not be properly soldered since the heat can not reach the components. It is preferable to solder the frame with the lid attached because you save work operations. However according to prior art there are problems getting a good solder joint, when using a pre-joined shielding can.

During the soldering process the printed circuit boards are moved continuously through an oven. When the printed circuit board leaves the oven a significant temperature gradient is generated and this causes the soldering to congeal from one end towards the other end. Due to internal stress, caused because one end of the shielding can is in a hot area while the other end is starting cooling off, in the shielding cans, they tend to start lifting in the hottest end prior to the congealing. The internal stress, causing the lifting, is a problem, when having rather thin material in the shielding can. To avoid these kinds of problems one has until now relied on: manual soldering, smaller shielding cans, thicker material in the shielding cans, a lower cooling gradient or soldering of the frame without the lid.

SUMMARY OF THE INVENTION

An object of the invention is to provide a shielding can for a printed circuit board.

This objective is obtained by a substantially rectangular shielding can, which include side walls or a frame and a lid adjacent to the side walls. The lid has means for increasing the flexibility of the lid. This flexibility is, according to the preferred embodiment, obtained by providing at least one slit that is adjacent to the sides of the lid and extending substantially transverse thereto. There ought to be at least two slits on the lid, one on each side of the lid that is exposed for a significant temperature gradient during the soldering process. There could be slits on the other sides to simplify the production of the shielding cans. Then the pick-and-place machine does not have to care about the orientation of the shielding can when placing the can on the printed circuit board.

Another object of the invention is to provide a communication terminal with a printed circuit board having shielding cans.

This is achieved through a communication terminal with a printed circuit board having shielding cans where said shielding cans are substantially rectangular and includes side walls and a lid adjacent to the side walls, where the lid has means for increasing the flexibility of the lid. The means for increasing the flexibility of the lid, according to the preferred embodiment, are slits on at least two sides of the lid, where the each slit is adjacent to the sides of the lid and extending substantially transverse thereto.

Yet another object of the invention is to provide an improved method of attaching a shielding can to a printed circuit board This purpose is obtained by a shielding can, which comprise two parts, a frame with side walls and a lid, adjacent attached to the frame. The mounting of shielding cans is executed by e.g. a pneumatical device (pick and place machine) that places the shielding can onto a printed circuit board, which has been prepared with solder paste, in one joined piece. After that the printed circuit board is warmed to soldering the shielding can onto the printed circuit board, where the soldering temperature increases slowly to make the solder paste melt entirely. This is followed by a fast cooling phase, where the shielding can has means for increasing the flexibility of the lid, formed by slits on the sides of the lid, to adapt to the temperature changes.

With this method it is possible to handle and to mount the shielding can in one step and thereby reducing the working steps.

BRIEF DESCRIPTION OF THE DRAWINGS

The invention will be explained more fully below, by way of example, in connection with preferred embodiments and with reference to the drawings, in which.

DETAILED DESCRIPTION OF THE INVENTION

Figure 1:
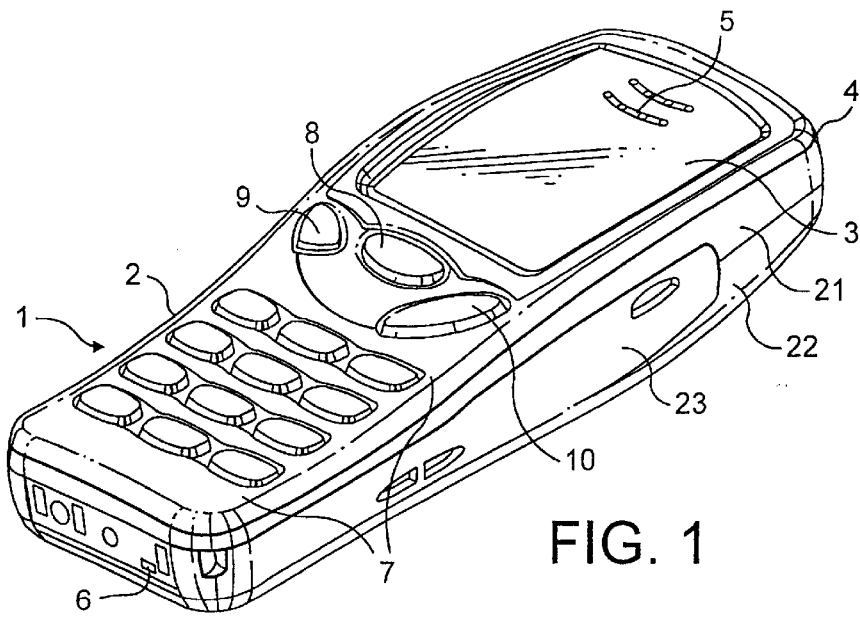
FIG. 1 schematically illustrates a preferred embodiment of a hand portable phone having a shielding can according to the invention.

FIG. 1 shows a preferred embodiment of a phone according to the invention, and it will be seen that the phone, which is generally designated by 1, comprises a user interface having a keypad 2, a display 3, an on/off button 4, a speaker 5, and a microphone 6 (only openings are shown). The phone 1 according to the preferred embodiment is adapted for communication via a cellular network, e.g. a GSM network. However the invention could have been implemented in any other communication terminal having a shielding can.

According to the preferred embodiment the keypad 2 has a first group 7 of keys as alphanumeric keys, two soft keys 8, two call handling keys 9, and a navigation key 10. The present functionality of the soft keys 8 is shown in separate fields in the display 3 just above the keys 8, and the call handling keys 9 are used for establishing a call or a conference call, terminating a call or rejecting an incoming call.

Figure 2:
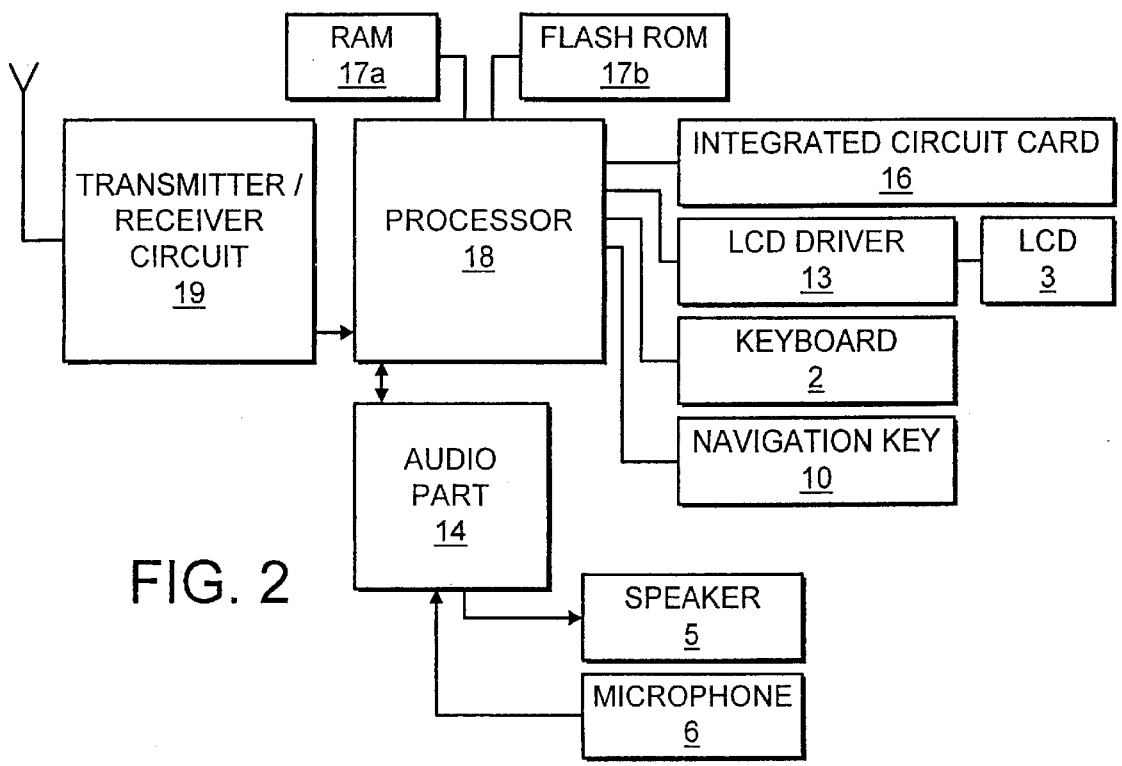
FIG. 2 schematically shows the essential parts of a telephone for communication with a cellular network.

FIG. 2 schematically shows the most important parts of a preferred embodiment of the phone, said parts being essential to the understanding of the invention. The preferred embodiment of the phone of the invention is adapted for use in connection with the GSM 900 MHz and GSM 1800 MHz network, but, of course, the invention may also be applied in connection with other phone networks. The processor 18 controls the communication with the network via the transmitter/receiver circuit 19 and an antenna 20 that will be discussed in details below.

The microphone 6 transforms the user's speech into analog signals, the analog signals formed thereby are A/D converted in an A/D converter (not shown) before the speech is encoded, in an audio part 14. The encoded speech signal is transferred to the processor 18, which i.e. supports the GSM terminal software. The processor 18 also forms the interface to the peripheral units of the apparatus, including a RAM memory 17a and a Flash ROM memory 17b, an integrated circuit card 16 (for GSM a SIM card), the display 3 and the keypad 2 (as well as data, power supply, etc.). The audio part 14 speech-decodes the signal, which is transferred from the processor 18 to the earpiece 5 via a D/A converter (not shown).

Figure 3A:
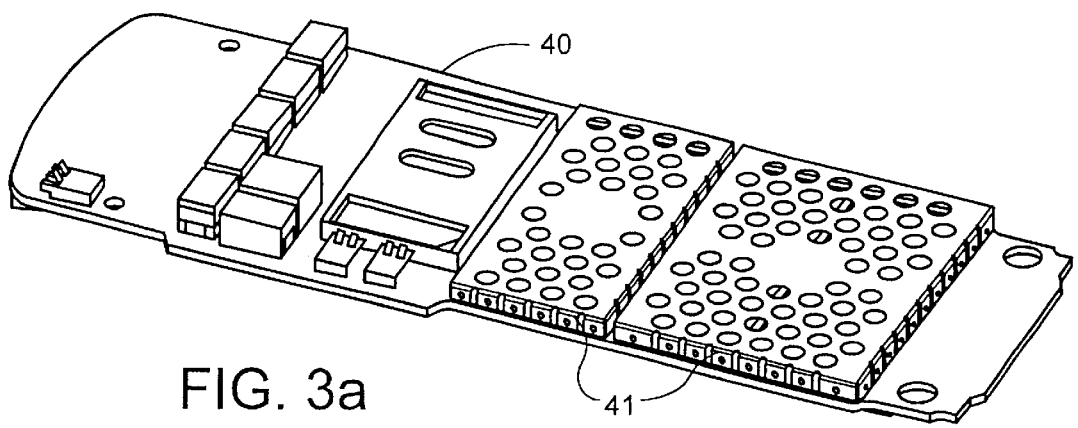
FIGS. 3a–b shows a printed circuit board having a shielding can according to the invention.
Figure 3B:
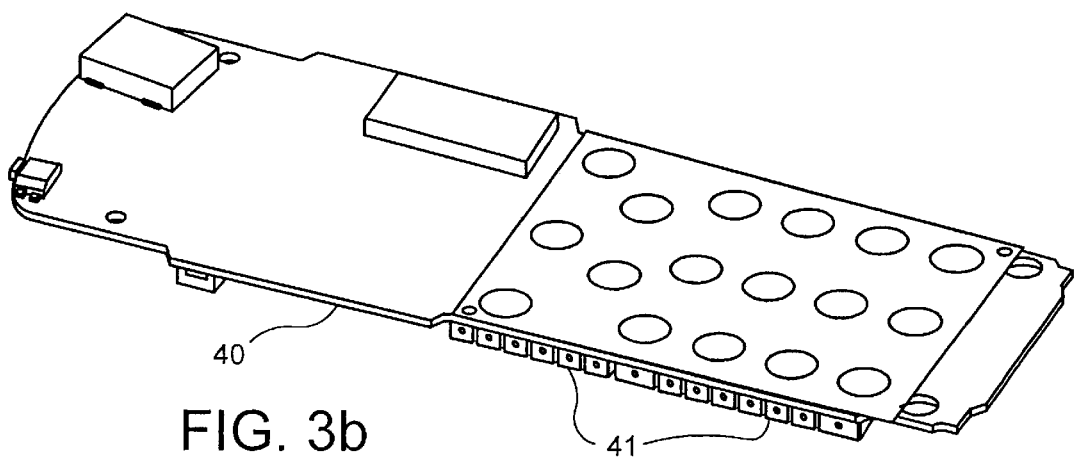

FIGS. 3a and 3b shows a printed circuit board 40 with two shielding cans 41 mounted thereon, which covers some electronic components. The printed circuit board 40 is an inner part of the phone 1 (shown in FIG. 1).

Figure 4:
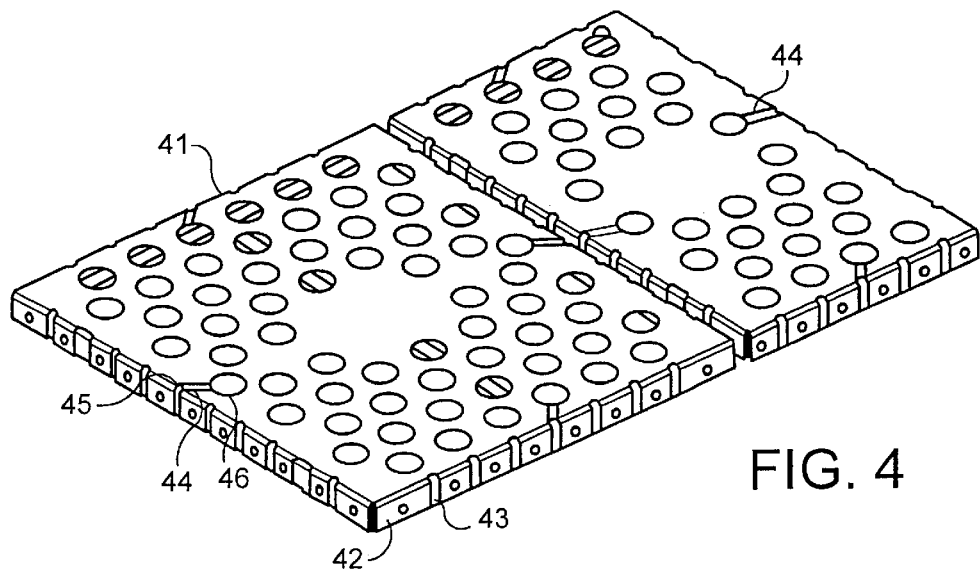
FIG. 4 shows a shielding can according to the invention.

FIG. 4 shows the shielding can 41 where lid 42 is joined onto the frame 43, as when the shielding can 41 is mounted onto the printed circuit board 40. It also shows the slits 44, which extends from the edge 45 of the lid 42 into holes 46. The main purpose of the holes 46 is to enable a sufficient heat distribution, when heating the printed circuit board 40 to solder the shielding can 41 and the electronic components shielded by it, onto the printed circuit board 40. The angle between the edge 45 of the lid 42 and the longitudinal direction of the slit 44 extends substantially transversal from the edge 45. Preferably the slit 44 connects an aperture 38 in the main area of the lid 42 adjacent to the edge 45 and one of the slits 39 serving to establish the connection between the lid and the frame.

Figure 5:
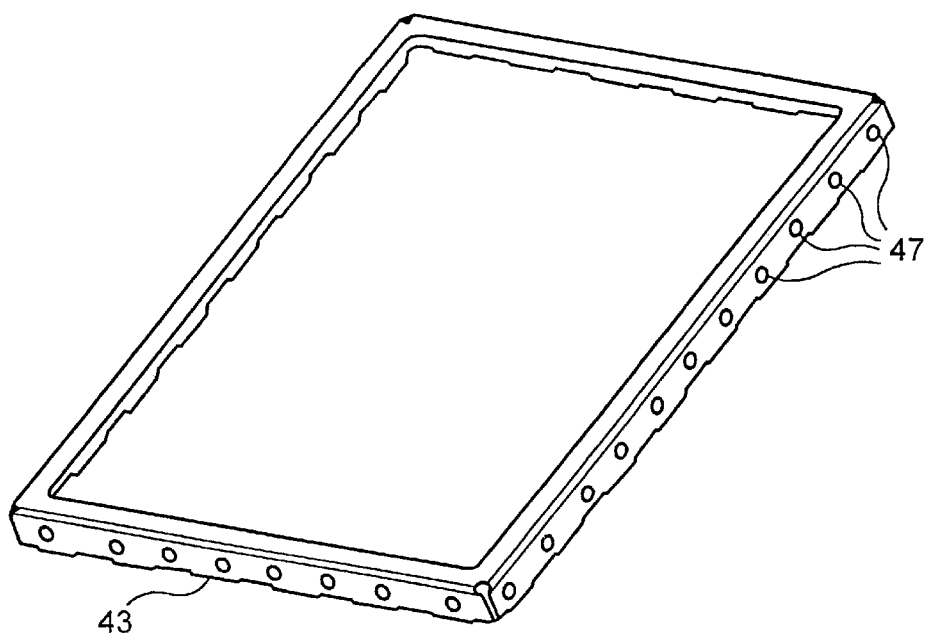
FIG. 5 shows a frame according to the invention.
Figure 6:
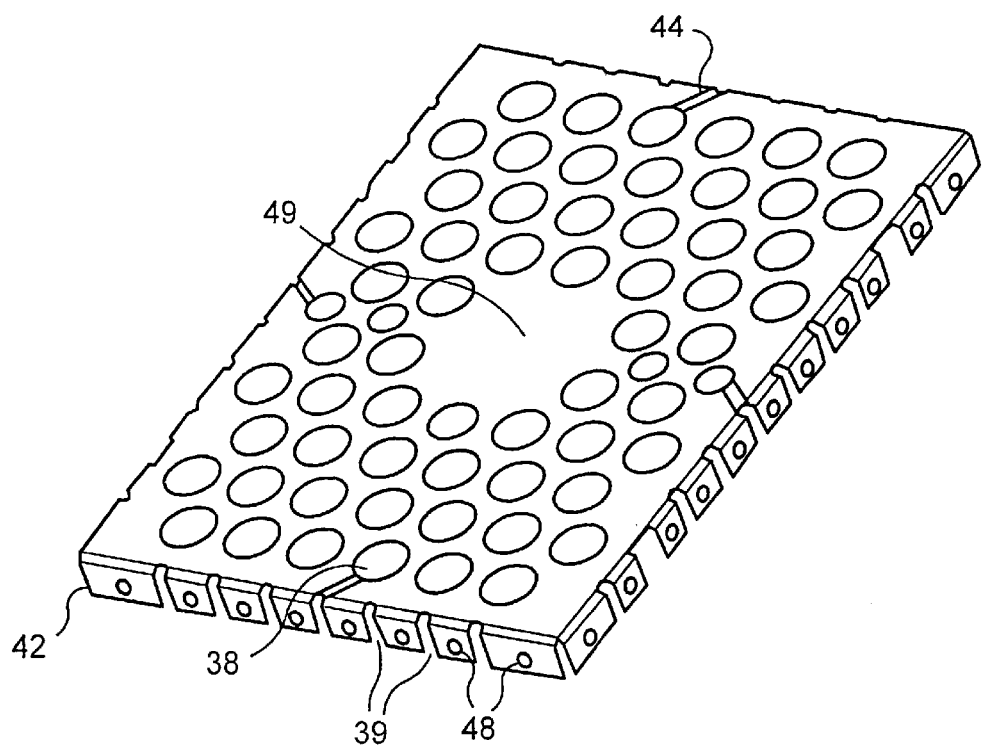
FIG. 6 shows a lid according to the invention.

FIG. 5 shows the frame 43, which consists of side walls with fastening holes 47. The fastening holes 47 are used to snap on the lid 42. As shown in FIG. 6 the lid 42 has protrusions 48 on its side walls, which snaps onto the holes 47 on the frame.

AN EXAMPLE OF MOUNTING THE SHIELDING CAN ONTO THE PRINTED CIRCUIT BOARD

Figure 7:
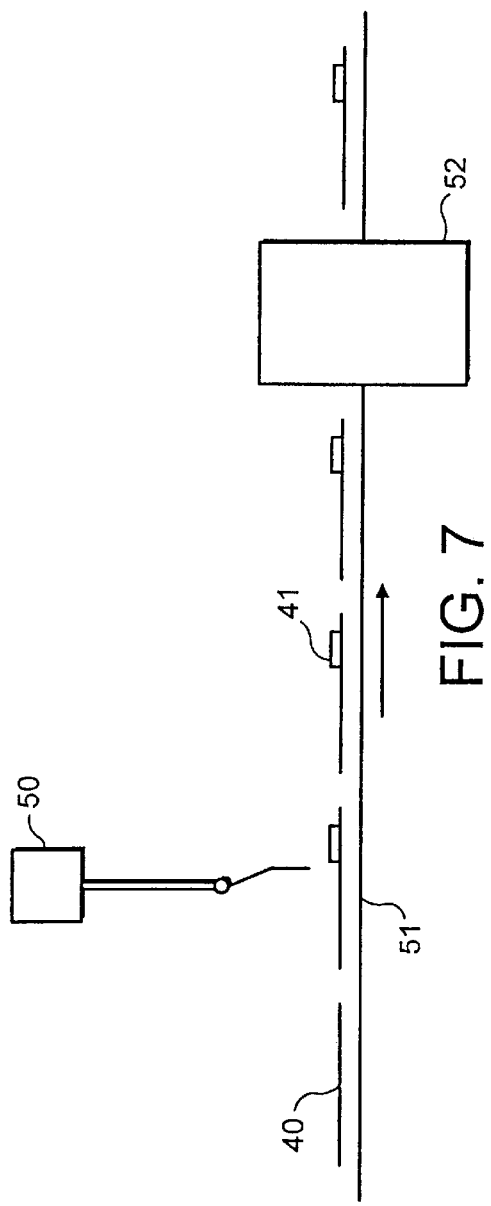
FIG. 7 shows an overview of the mounting process of the shielding can onto the printed circuit board.
Figure 8:
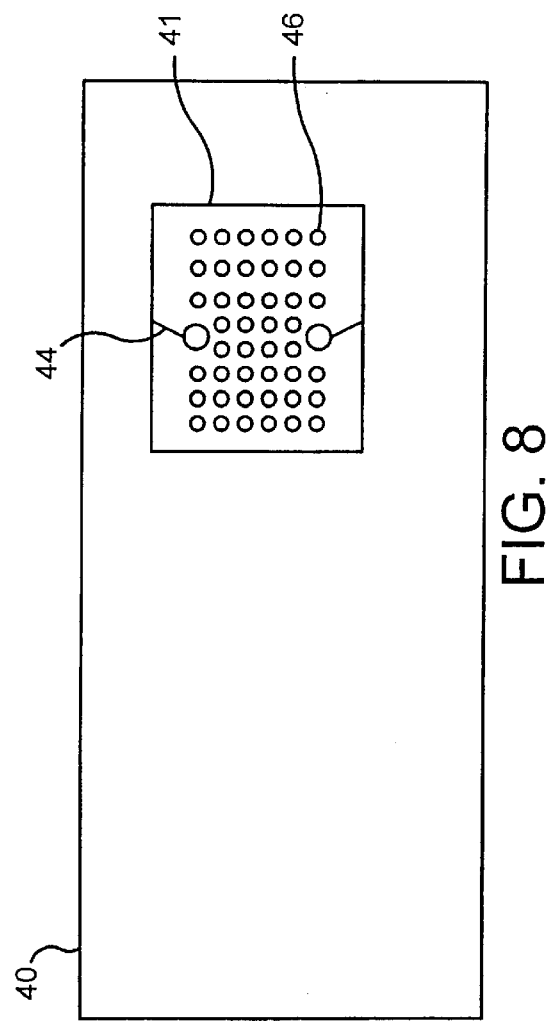
FIG. 8 shows a printed circuit board having a shielding can according to the invention.

FIG. 7 shows a schematic view of the mounting process of shielding can 41 onto the printed circuit board 40. A lifting device 50 attached to the shielding can at the spot 49 (shown in FIG. 6) and lifts via vacuum pressure the shielding can and places it onto the printed circuit board 40. The printed circuit board 40 has been prepared with solder paste in advance. After that a conveyor device 51 takes the printed circuit board 40 through an oven 52, where it is conveyed through to heat it up to solder the shielding can 41 onto the printed circuit board 40. The soldering temperature increases slowly to make the solder paste melt entirely, and is followed by a fast cooling phase, where the shielding can 41 has means for increasing the flexibility of the lid 42, formed by slits 44 on the sides of the lid, to adapt to the temperature changes.

The invention is not limited to the above described and in the drawings shown examples of an embodiment but can be varied within the scope of the appended claims. For example, it is also possible to have other flexible means than a slit, e.g. a spring.

What is claimed is:

1. A shielding can mountable on a top surface of a printed circuit board, said shielding can comprising:
   a frame, attachable to the top surface of the printed circuit board, being of substantially rectangular shape and having side walls; and
   a lid having a top surface which extends in a horizontal direction and side surfaces which extend from the top surface of said lid in a vertical direction with respect to the horizontal direction of the top surface of said lid,
   wherein said lid can be disposed adjacent to the side walls of said frame in a manner such that said frame and said lid form an enclosed area with the top surface of the printed circuit board, and
   wherein said lid further includes means, provided on the top surface of said lid, for increasing the flexibility of said lid in at least the horizontal direction of said lid.

2. A shielding can according to claim 1, wherein said means for increasing the flexibility of said lid are slits on at least the top surface of said lid.

3. A shielding can according to claim 2, wherein said slits are adjacent to the side surfaces of said lid and extend substantially transverse thereto.

4. A shielding can according to claim 2, wherein said slits extend to the side surfaces of said lid, and wherein said slits extend substantially transverse to a moving direction of the printed circuit board during soldering.

5. A shielding can mountable on a top surface of a printed circuit board, said shielding can comprising:
   a frame, attachable to the printed circuit board, being of substantially rectangular shape and having side walls; and
   a lid having a top surface which extends in a horizontal direction and side surfaces which extend from the top surface of said lid in a vertical direction with respect to the horizontal direction of the top surface of said lid,
   wherein said lid can be disposed adjacent to the side walls of said frame in a manner such that said frame and said lid form an enclosed area with the top surface of the printed circuit board,
   wherein said lid further includes means for increasing the flexibility of said lid in at least the horizontal direction of said lid,
   wherein said flexibility is accomplished through slits disposed on at least two points on the top surface of said lid, and
   wherein said slits are adjacent to the side surfaces of said lid extending substantially transverse thereto.

6. A communication terminal comprising:
- a printed circuit board onto which a shielding can is mounted on a top surface of the printed circuit board,
- wherein said shielding can comprises:
  - a frame, attachable to the printed circuit board, being of substantially rectangular shape and having side walls, and
  - a lid having a top surface which extends in a horizontal direction and side surfaces which extend from the top surface of said lid in a vertical direction with respect to the horizontal direction of the top surface of said lid,
  - wherein said lid can be disposed adjacent to the side walls of said frame in a manner such that said frame and said lid form an enclosed area with the top surface of the printed circuit board, and
  - wherein said lid further includes means, provided on the top surface of said lid, for increasing the flexibility of said lid in at least the horizontal direction of said lid.

7. A communication terminal according to claim 6, wherein said means for increasing the flexibility of said lid are slits on at least the top surface of said lid.

8. A communication terminal according to claim 7, wherein said slits are adjacent to the side surfaces of said lid and extend substantially transverse thereto.

9. A communication terminal according to claim 8, wherein said slits are placed on at least two points on said lid, and
- wherein said slits are adjacent to the side surfaces of said lid and extend substantially transverse thereto.

10. A method for mounting shielding cans, which includes a frame and a lid, on printed circuit boards comprising the steps of:
- placing, onto a top surface of the printed circuit board, which has been prepared with solder paste, the shielding can in one joined piece,
- warming the printed circuit board to solder the shielding can onto the printed circuit board; and
- slowly increasing the soldering temperature to make the solder paste melt entirely followed by a fast cooling phase,
- wherein said shielding can comprises:
  - a frame, attachable to the top surface of the printed circuit board, being of a substantially rectangular shape and having side walls, and
  - a lid having a top surface which extends in a horizontal direction and side surfaces which extend from the top surface of said lid in a vertical direction with respect to the horizontal direction of the top surface of said lid,
  - wherein said lid can be disposed adjacent to the sidewalls of said frame in a manner such that said frame and said lid form an enclosed area with the top surface of the printed circuit board, and
  - wherein said lid further includes:
    - means, provided on the top surface of said lid, for increasing the flexibility of said lid in at least the horizontal direction of said lid,
    - wherein said means for increasing flexibility is formed by slits on the top surface of said lid, to adapt said lid to temperature changes.

* * * * *